United States Patent [19]
Singh et al.

[11] Patent Number: 6,063,531
[45] Date of Patent: May 16, 2000

[54] FOCUS MONITOR STRUCTURE AND METHOD FOR LITHOGRAPHY PROCESS

[75] Inventors: Bhanwar Singh, Morgan Hill; Bharath Rangarajan, Santa Clara; Khoi Anh Phan; Carmen L. Morales, both of San Jose, all of Calif.

[73] Assignee: Advanced Micro Devices, Inc., Sunnyvale, Calif.

[21] Appl. No.: 09/167,417

[22] Filed: Oct. 6, 1998

[51] Int. Cl.⁷ ........................................ G03F 9/00
[52] U.S. Cl. ............................. 430/30; 356/401
[58] Field of Search .................. 430/5, 22, 30; 356/401; 438/975

[56] References Cited

U.S. PATENT DOCUMENTS

| | | | |
|---|---|---|---|
| 5,087,537 | 2/1992 | Conway et al. | 430/30 |
| 5,731,877 | 3/1998 | Ausschnitt | 356/375 |
| 5,757,507 | 5/1998 | Ausschnitt et al. | 356/401 |
| 5,770,337 | 6/1998 | Chiang | 430/22 |
| 5,776,640 | 7/1998 | Bae | 430/5 |
| 5,790,254 | 8/1998 | Ausschnitt | 356/372 |

*Primary Examiner*—Christopher G. Young
*Attorney, Agent, or Firm*—Skjerven, Morrill, MacPherson, Franklin and Friel

[57] ABSTRACT

A focus monitor structure is placed on a reticle or mask near the production device structures, such as integrated circuits, to monitor the focal conditions of the lithography process as well as other parameters, such as the critical dimension, and proximity effects. The focus monitor structure includes a series of densely packed parallel lines and an isolated line along with a line that is positioned orthogonally to the densely packed lines forming an "L" shaped structure. The focus monitor structure also includes a plurality of rectangular islands that create post structures when patterned in the resist layer. The lines of the focus monitor structure are approximately the critical dimension and the rectangular islands vary in width between ±10% of the critical dimension. By manually or automatically inspecting the focus monitor structure after it is patterned into a layer of resist, including measuring the width of the resist lines and the resist profile angle of the orthogonal line, information relating to the critical dimension as well as the focal conditions of the lithography process can be determined.

20 Claims, 8 Drawing Sheets

FOCUS MONITOR STRUCTURE AND METHOD FOR LITHOGRAPHY PROCESS

FIELD OF THE INVENTION

The present invention relates to manufacturing processes requiring lithography and, in particular, to a lithography imaging device such as a reticle or mask with a test structure that permits the monitoring of the focus and critical dimension of the printed pattern images.

BACKGROUND

Lithography has a variety of useful applications, including the manufacture of semiconductor devices, flat-panel displays, and disk heads. Lithography is used to transmit a pattern on a mask or reticle to a resist layer on a substrate through spatially modulated light. The resist layer is then developed and the exposed pattern is either etched away (positive resist) or remains (negative resist) to form a three dimensional image pattern in the resist layer. The three dimensional image pattern can then be etched into the substrate or serve as a mask for implantation.

The quality of the image pattern that is developed in the resist layer is effected by exposure and focus. Exposure determines the average energy of the image per unit area and is set by the illumination time and intensity. One effect of changing the value of the exposure is changing the critical dimension (CD) of the lithographically produced lines. The CD is the smallest resolvable dimension of a line or space.

Focus determines the decrease in modulation relative to the in-focus image. Focus is set by the position of the surface of the resist layer relative to the focal plane of the imaging system.

Local variations of exposure and focus can be caused by variations in the resist layer thickness, substrate topography, as well as stepper focus drift. Because of possible variations in exposure and focus, image patterns generated through lithography require monitoring to determine if the patterns are within an acceptable tolerance range. Focus and exposure control are particularly important where the lithographic process is being used to generate sub-micron lines.

Test patterns are sometimes included on the production mask in the scribe line areas. The test patterns can then be transmitted onto the surface of the resist along with the image of the desired device, e.g., an integrated circuit. The image of the test pattern can then be monitored to determine if the image of the desired device is within specification.

FIG. 1 is an example of a conventional test pattern 10 including two tuning fork patterns 12 and 14 in the X and Y coordinate directions, respectively. As shown in FIG. 1, tuning fork pattern 14 is a line/space pattern with densely packed lines 14a and an isolated line 14b. Tuning fork patterns 12 and 14 are useful in measuring the proximity effect associated with the uniformity of the CD in the X and Y directions. The proximity effect alters the uniformity of the CD due to diffraction. Diffraction will reduce the CD of densely packed lines, i.e., lines 14a, and will increase the CD of an isolated line 14b. By measuring the CD of the densely packed lines 14a and isolated line 14b, it can be determined whether the line widths fall within an acceptable range, which is typically ±10 percent of the CD.

While test pattern 10 is useful in monitoring the critical dimension and the proximity effect, it does not provide information relating to whether or not the pattern is in focus. Consequently, a separate test pattern must be used to monitor the focus.

The test pattern features are typically measured using a scanning electron microscope (SEM), particularly where the feature size is sub-micron. Where several different test patterns require measurement, for example, where patterns useful in measuring the CD and the focus are located on different test patterns, the SEM must be adjusted to individually view each separate pattern. Repositioning the substrate relative to the SEM so that the SEM may view different test patterns requires time, which reduces the throughput of the system.

Accordingly, there is need for a lithographic test structure that provides information relating to focus and the uniformity of the critical dimension without requiring inspection of separate patterns or the use of a separate test masks.

SUMMARY

The focus monitor structure in accordance with an embodiment of the present invention is a test structure that can be used to monitor not only the critical dimension and the proximity effect during the lithographic process, but the focal conditions of the process as well. The focus monitor structure is placed on a reticle or mask and in one embodiment includes a plurality of substantially parallel lines in the form of densely packed lines, at least one additional isolated line, an orthogonal line positioned orthogonally to the densely packed lines to form an "L" shaped structure, and a plurality of rectangular islands, which are called post structures, because they generate post-like structures when patterned into a layer of resist. The elements of the focus monitor structure may be in a clear field or dark field or both on the reticle or mask. The lines of the focus monitor structure are approximately the critical dimension and the post structures vary in size between ±10% of the critical dimension or some other desired percentage.

The focus monitor structure is lithographically transferred to a resist layer on a substrate. The resist layer is developed to generate a three dimensional image of the focus monitor structure patterned in the resist layer. The patterned resist layer is then inspected, for example, by a SEM. By measuring the angle of the resist profile at an end of the orthogonal line forming the L shaped structure, the focal condition of the lithographic process can be determined. If there is a negative resist profile the stepper is focused above the optical center of the resist layer, while a positive resist profile indicates the stepper is focused below the optical center of the resist layer. A vertical profile indicates an optimum focal condition. In addition, the width of the lines can be measured to determine the critical dimension of the lithographic process and information relating to the proximity effect.

BRIEF DESCRIPTION OF THE DRAWINGS

The above and other features, aspects, and advantages of the present invention will become better understood with regard to the following description, appended claims, and accompanying figures, where:

FIG. 3 illustrates a top plan view of a photo monitor cluster including two focus monitor structures;

DETAILED DESCRIPTION

Figure 2:
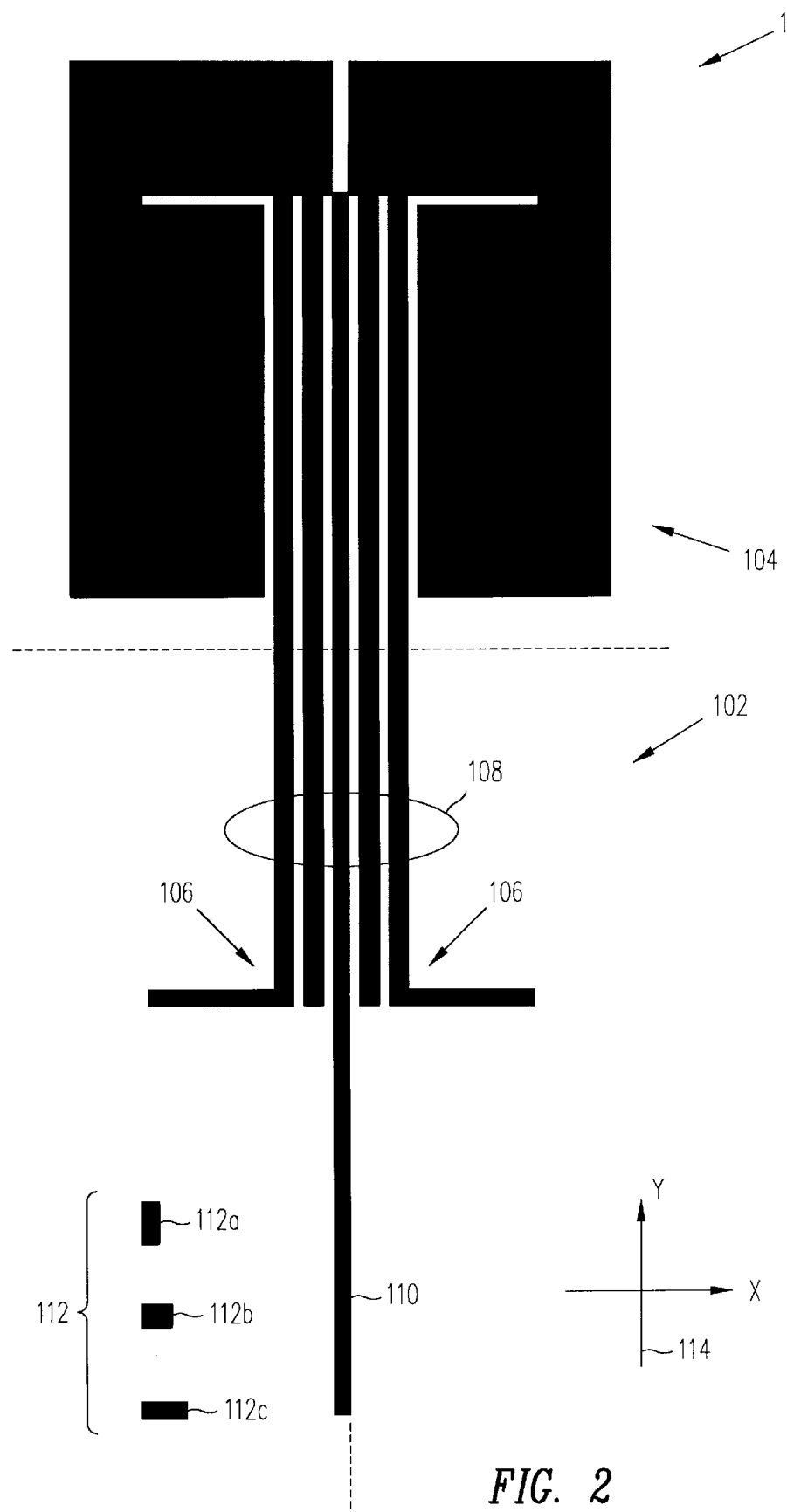
FIG. 2 illustrates a plan view of focus monitor structure, including an L shaped structure, densely packed lines, an isolated line, and post structures, in accordance with one embodiment of the present invention.

FIG. 2 illustrates a plan view of focus monitor structure 100 that is used to monitor the focal conditions of a lithographic process, in accordance with one embodiment of the present invention. Focus monitor structure 100 is a test structure that is not only useful in monitoring focal conditions, but is also used to monitor other parameters, such as the CD and the proximity effect.

Focus monitor structure 100 is patterned on a reticle, mask or other similar type of lithographic imaging device, which will hereinafter be refereed to as a reticle for ease of reference. By way of an example, focus monitor structure 100 is patterned in chrome overlying a quartz substrate using conventional optical or electron beam methods well understood by those of ordinary skill in the art. Focus monitor structure 100 is patterned on a reticle using the same process and at the same time as the patterning of the production device structures, e.g., integrated circuits, on the reticle.

As can be seen in FIG. 2, focus monitor structure 100 includes a clear field pattern 102 and a dark field pattern 104 located below and above the dotted line, respectively. The elements within the clear field pattern 102 include a plurality of substantially parallel densely packed lines 108, at least one isolated line 110, two orthogonal lines positioned orthogonally to the densely packed lines 108 to form "L" shaped structures 106, and a plurality of rectangular islands referred to as post structures 112 because the rectangular islands generate three dimensional post-like structures when lithographically transferred to the resist layer. It should be understood that while the orthogonal lines that create the L shaped structure 106 are preferably 90 degrees from the densely packed lines 108 or isolated line 110, the precise angle may vary. Variation in the angle between the orthogonal lines and the densely packed lines 108 or isolated line 110 can be compensated for when determining the angle of the resist profile.

In order for focus monitor structure 100 to be useful in monitoring whether the production devices structures are being accurately transferred from the reticle to the resist layer, the line widths of the elements in focus monitor structure 100 should be approximately equal to the minimal width of the lines in the production device structures. Thus, the line widths of the elements of focus monitor structure 100 are at the critical dimension.

For current technology, the line widths are in the range of 0.18–0.50 µm (micrometer) and can be scaled down in sub-0.18 µm technology, but of course may be much smaller with future technology advances. The typical L shaped structure 106 may extend approximately 1–5 µm in the X coordinate direction, as indicated by coordinate axes 114, which are for illustration only and are not part of focus monitor structure 100. Densely packed structure 108 may extend approximately 1–10 µm from the dark field pattern 104 in the Y coordinate direction, and isolated structure 110 may extend approximately 1–10 µm from densely packed structure 108 also in the Y coordinate direction. Of course, the above dimensions may vary if desired.

Post structures 112 include three individual rectangular islands or posts 112a, 112b, and 112c, which have X and Y dimensions of approximately 1F×3F, 1F×1F, and 3F×1F, respectively, where F is the size of a feature at the critical dimension. Of course, post structures 112a, 112b, and 112c may have any desired dimensions, such as −10%CD, CD, and +10%CD, respectively, but should be close to the critical dimension. Further, the specific number of post structures 112 is illustrative only, and thus any number of post structures 112 may be used.

The dark field pattern 104 of focus monitor structure 100 similarly includes L shaped structures and densely packed and isolated lines. The dark field pattern 104 does not include post structures or holes, which would be the dark field equivalent to post structures 112. If desired, however, dark field pattern 104 may include holes.

Figure 1:
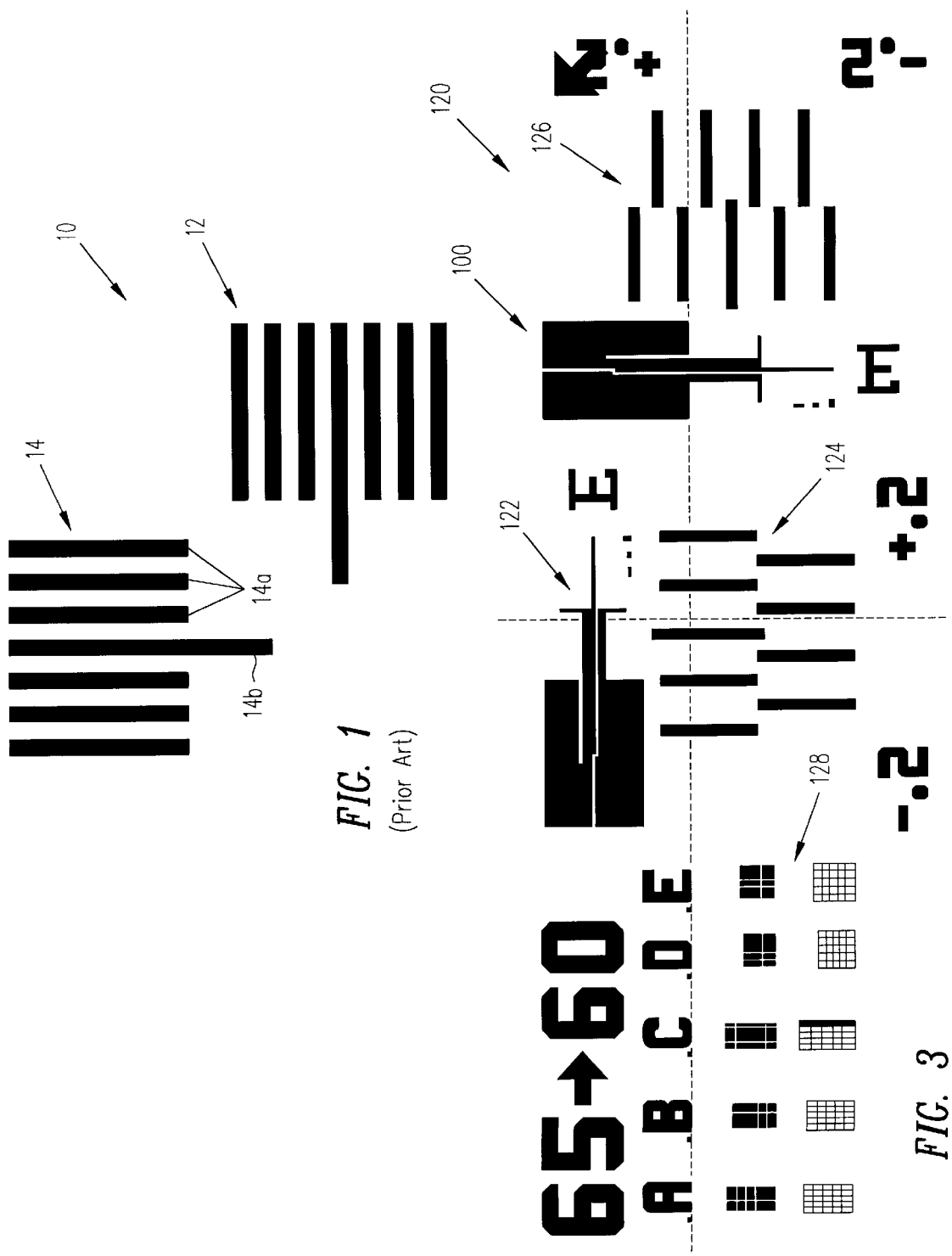
FIG. 1 shows conventional tuning fork structures in orthogonal coordinate directions.

Focus monitor structure 100 may be placed in a cluster of other monitoring structures on the reticle. For example, FIG. 3 illustrates a top plan view of a photo monitor cluster 120, which includes two focus monitor structures 100 and 122. As shown in FIG. 3, focus monitor structures 100 and 122 are in orthogonal coordinate directions, however, only one of the focus monitor structures 110 and 122 needs to be inspected in order to obtain information relating to both CD and focal conditions. In conventional test patterns, however, such as that shown in FIG. 1, both tuning forks 12 and 14 must be inspected to obtain the same information. Photo monitor cluster 120 also includes other monitoring structures such as an overlay monitor structures 124 and 126 and resolution monitor structures 128.

Figure 4:
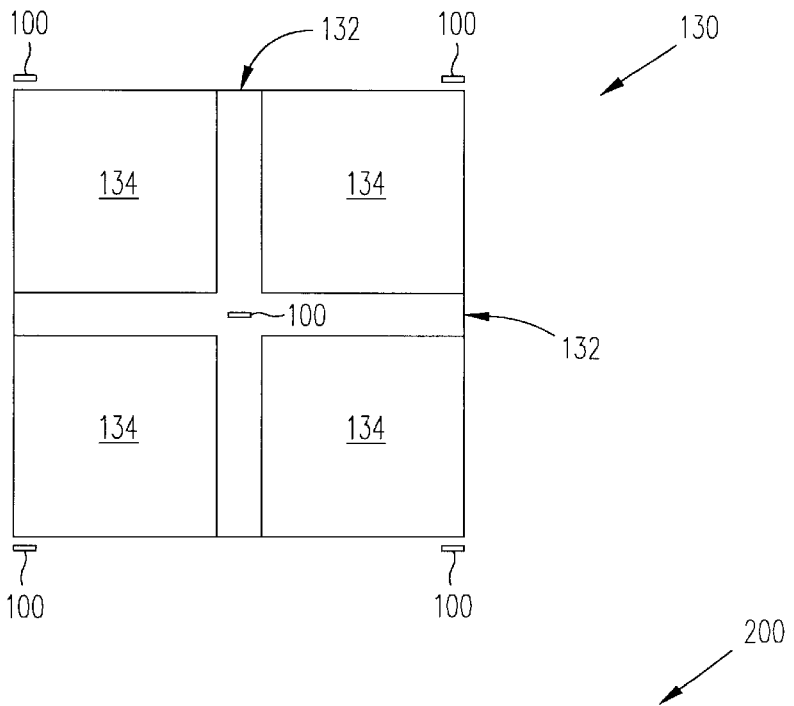
FIG. 4 illustrates a reticle field with focus monitor structures, either independently or as part of a photo monitor structure, placed at the four corners and in the scribe line between the production device structures.

Focus monitor structure 100 is placed near production device structures on the reticle so that the focus monitor structure 100 can be used to accurately monitor the CD, proximity effects, and focal conditions of patterns transmitted from the reticle to a layer of resist on a substrate. Focus monitor structure 100 is placed on areas of the reticle that are not occupied by the product device structures or other monitoring structures. As shown in FIG. 4, by way of an example, focus monitor structure 100, either independently or as part of photo monitor structure 120, is placed at the four corners of the reticle field 130 and in the center of reticle field 130, i.e., in the scribe line 132 between production device structures 134. Accordingly, focus monitor structure 100 does not interfere with the production device structures 134 but can be used to monitor and evaluate the CD, proximity effect, and focal conditions of the transmitted patterns. It should be understood that where a different size reticle field or a mask is used, focus monitor structure 100 should be placed near any production device structures.

Using a stepper machine or other exposure apparatus, focus monitor structure 100, along with any production device structures, can then be transferred from the reticle onto a layer of resist on a substrate. The resist can then be developed. A manual or automatic after develop inspection is then performed, in which the focus monitor structure 100 patterned into the resist is examined. An angled SEM, or any other type of topography imaging apparatus, such as an atomic force microscope, may be used to inspect the resist patterned with focus monitor structure 100. By measuring the widths of the lines in the resist, the resist profiles, and inspecting the post structures 112, information relating to the critical dimension, and the stepper focal condition can be determined, so that the exposure and focus for the production lots can be properly adjusted. If the inspection indicates that the features developed in the resist are within specified tolerances, the processing of the substrate continues by etching the patterns, including the production device structures and the focus monitor structure, into the substrate. However, if the inspection indicates that the features developed in the resist are outside specified tolerances, the inadequately processed substrate is stripped of the resist and reworked.

FIGS. 5A, 5B, 5C, 6A, 6B, 6C, 7A, and 7B discussed below were produced on an ASM/200 stepper [i-line] using Shipley S955 photoresist with a thickness of 1.23 $\mu$m and a typical exposure dose of 200 mjoule. A standard metal ion free developer Model 701 by Shipley, Inc. was used to develop the patterned image in the photoresist.

Figure 5A:
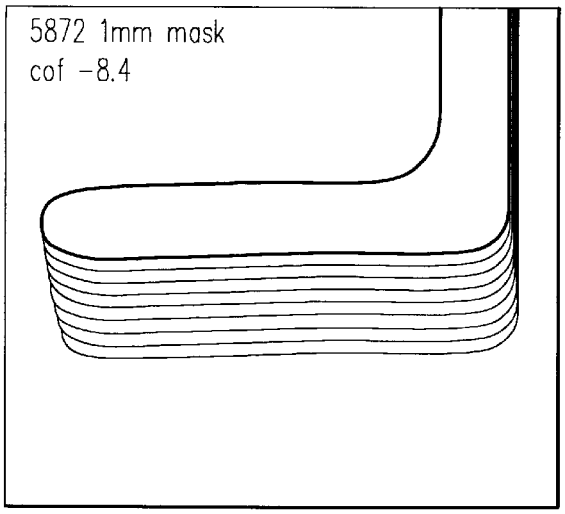
FIGS. 5A, 5B, and 5C are angled SEM photographs of a resist layer that has been patterned with an L shaped structure from a focus monitor structure at various focal conditions.
Figure 5B:
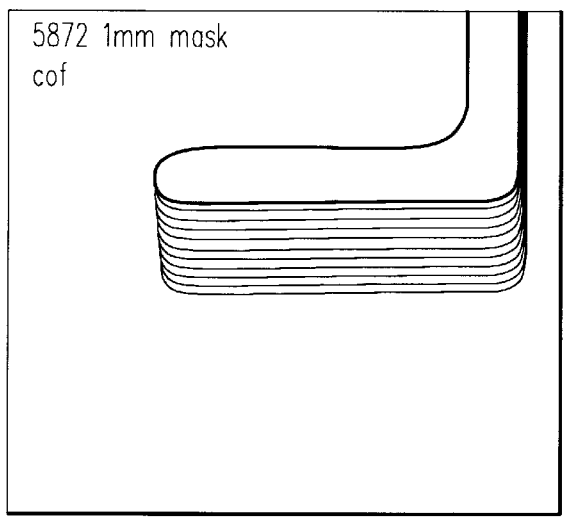
Figure 5C:
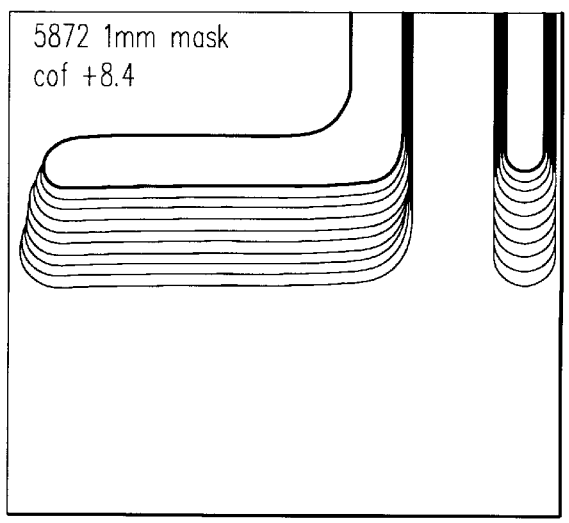

FIGS. 5A, 5B, and 5C are angled SEM photographs of a resist layer that has been patterned with an L shaped structure from a focus monitor structure at various focal conditions. Specifically, the pattern shown in FIG. 5A was produced by a stepper that was −0.4 $\mu$m out of focus, the pattern in FIG. 5B was produced in focus, and the pattern in FIG. 5C was produced by the stepper at +0.4 $\mu$m out of focus. As can be seen in FIGS. 5A, 5B, and 5C, the angle of the resist profile at the end of the L shaped structures varies as a function of the focus. Specifically, a vertical profile is produced by an in focus stepper, as shown in FIG. 5B, a positive profile is produced by a stepper that is focused below the optical center of the resist layer, as shown in FIG. 5C, and a negative profile is produced by a stepper that is focused above the optical center of the resist layer, as shown in FIG. 5A.

Figure 6A:
FIGS. 6A, 6B, and 6C are angled SEM photographs of a resist layer that has been patterned with post structures from a focus monitor structure at various focal conditions.
Figure 6B:
Figure 6C:

FIGS. 6A, 6B, and 6C are angled SEM photographs of a resist layer that has been patterned with post structures from a focus monitor structure, where the patterns in FIG. 6A were produced at −0.4 $\mu$m out of focus, FIG. 6B were produced in focus, and FIG. 6C were produced at +0.4 $\mu$m out of focus. Because the post structures of focus monitor structure 100 have dimensions of approximately 1F×3F, 1F×1F, and 3F×1F, the post structures can be used to provide information relating to the exposure dose. The post structure can also provide visual information regarding focus of the stepper. A negative profile will decrease the size of the base of the post structures. Where there is a large negative profile the post structure will not have enough support and will collapse, as shown in FIG. 6A. Thus, an SEM inspection of the post structures can quickly determine whether there is an absence of a post structure indicating that the stepper is focused above the optical center of the resist layer. Where the post structures have a positive profile, an SEM inspection will reveal that the base is larger than the top of the post structure indicating that the stepper is focused below the optical center of the resist layer.

Figure 7A:
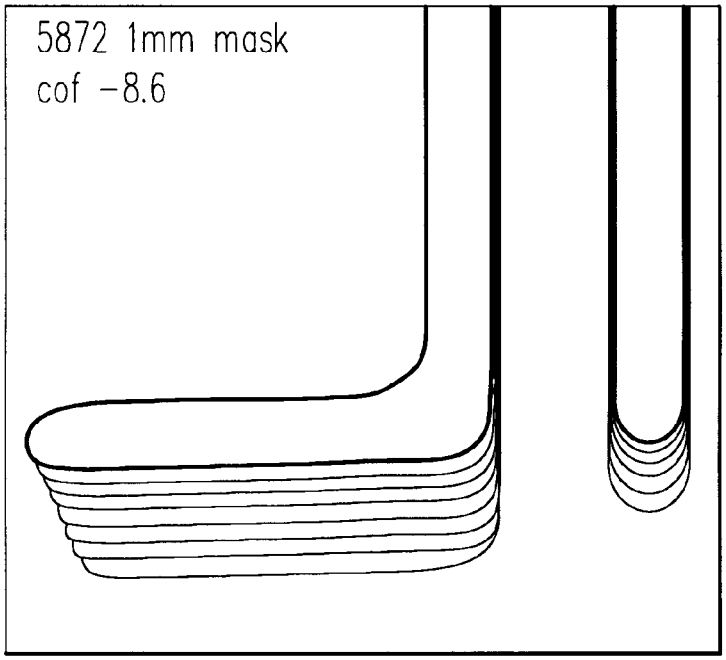
FIGS. 7A and 7B are angled SEM photographs of the respective L shaped structure and post structure from a focus monitor structure as patterned in a resist layer film by a stepper that is −0.6 µm out of focus.
Figure 7B:

FIGS. 7A and 7B are angled SEM photographs of the respective L shaped structure and post structure as produced in resist layer at −0.6 $\mu$m out of focus. As can be seen in FIG. 7A, the negative profile angle is large when the defocus is −0.6 $\mu$m. FIG. 7B shows only one post structure. The other post structures collapsed due to bases that were too small to support the structures. The small bases were caused by the extreme negative profile at −0.6 $\mu$m defocus.

Thus, as illustrated in FIGS. 5A–5C, 6A–6C, and 7A–7B, the resist patterns generated by focus monitor structure 100 can be inspected during processing of the substrate to determine whether the CD, the proximity effect, the focal conditions, and the dose are within specified tolerances. Each of these parameters can be quickly measured directly from the same focus monitor structure without necessitating locating, repositioning, and measuring a separate monitor structure.

As is understood by those of ordinary skill in the art, during processing of a device, different process layers may require different focus offsets. The optimum focus offsets are dependent on the particular process layer. Thus, for some layers it may be necessary to offset the focus to produce the desired profile angle of the resist layer. Through SEM inspection of the resist profiles generated by the L shaped structure 106, along with the densely packed, isolated lines 108 and 110, and the post structures 112, the focus monitor structure 100 can also provide the optimum focus offset for different process layers.

Figure 8:
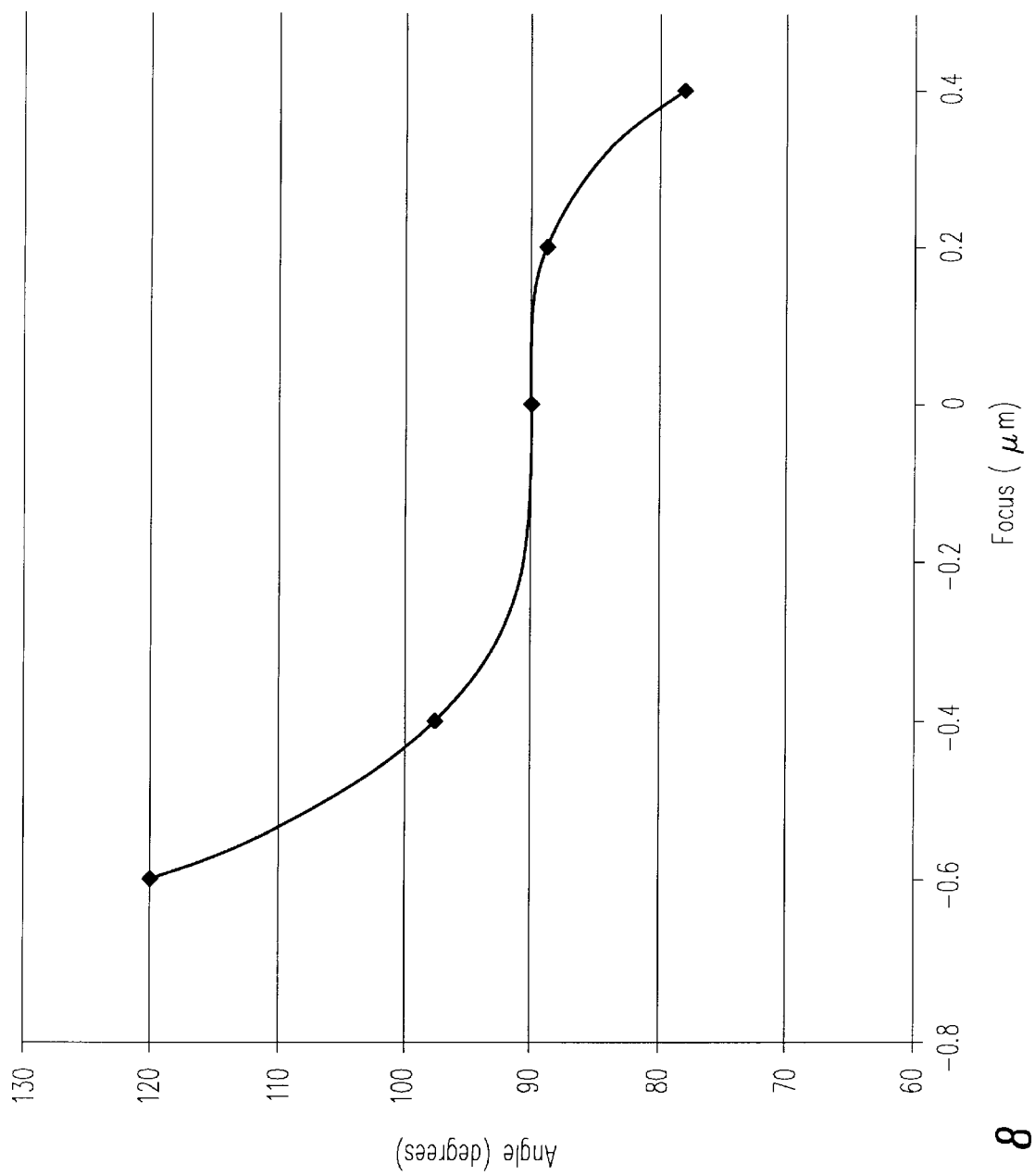
FIG. 8 is a graph illustrating the resist profile angle from the L shaped structures at the focus settings of FIGS. 5A, 5B, 5C, and 7A.

Further, it is possible to quantify a particular layer's focus offset by taking several SEM measurements of the resist profiles of the L shaped structure at various focus settings. FIG. 8 is a graph illustrating the resist profile angle from the L shaped structure at different focus settings. Thus, using the curve of FIG. 8, the amount of defocus can be determined for a specific process layer by measuring the profile angle of L shaped structure 106. The focus vs. profile angle can be determined for each layer of a production device. If during production, the resist pattern of L shaped structure 106 has a non-vertical profile angle, the amount of defocus can be determined using the focus vs. profile angle curve. Using FIG. 8 for example, if a resist profile angle is found to be 100 degrees, it can be seen that the defocus is approximately −0.4 $\mu$m. The appropriate adjustments to the stepper can then easily be made.

Figure 9:
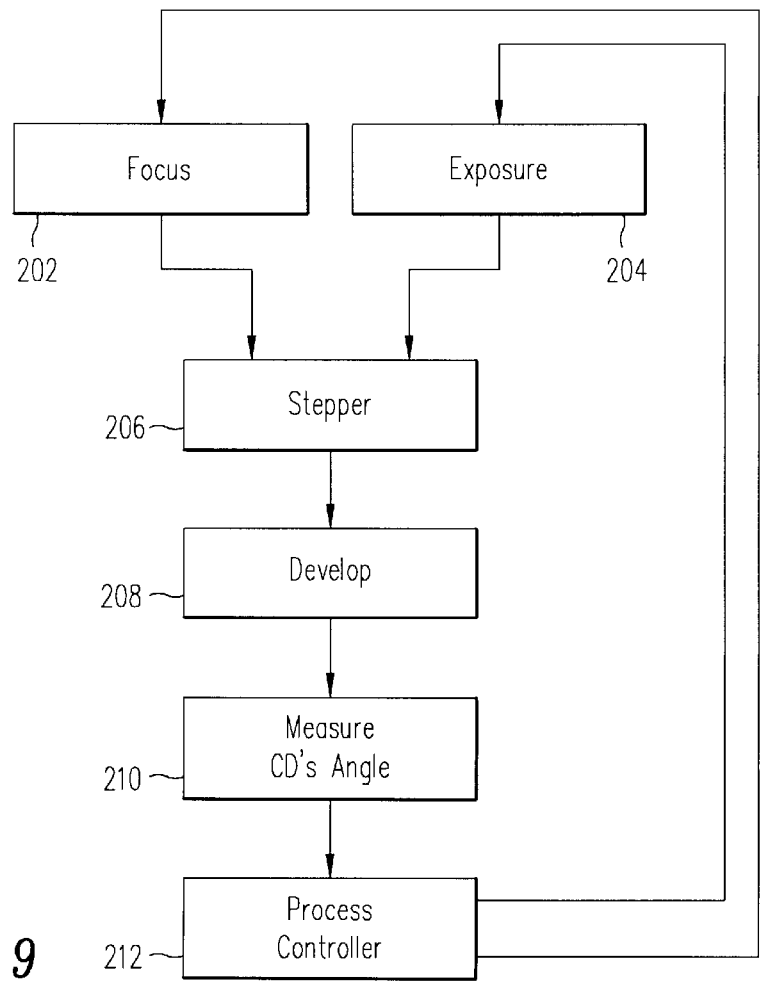
FIG. 9 is a flow chart showing the use of a focus vs. profile angle curve in a closed loop processing controller.

The use of a focus vs. profile angle curve, such as that shown in FIG. 8 can be automated. FIG. 9 is a flow chart showing the use of a focus vs. profile angle curve in a closed loop 200 processing controller. As shown in FIG. 9, focus 202 and dose 204 parameters are received by a stepper 206. Stepper 206 exposes production wafers with the desired device patterns and a focus monitor structure, such as focus monitor structure 100 shown in FIG. 2. If desired, the focus monitor structure may be exposed at several places on each production wafer. The images on the wafers, including the focus monitor structures, are developed at block 208.

The CD and angle of the profile are then measured at block 210 for a selected wafer, as discussed above. The wafer to be examined may be selected at specific intervals, such as every third wafer or one wafer per lot. The measured CD and angle of the profile is transmitted to a process controller 212, which determines whether the measured CD is the optimal CD. Process controller 212 may be a digital signal processor or micro-processor. Process controller 212 then changes the exposure 204 to produce the optimal CD. Where the CD is too large, the exposure level is increased to reduce the CD and vice versa, where the CD is too small, the exposure level is decreased. Adjusting the exposure level to alter the CD is well understood by those of ordinary skill in the art.

The measured angle of the profile is compared to a focus vs. angle of profile curve, which is stored in the memory of process controller 214. By comparing the measured angle of the profile to the focus vs. angle of profile curve, the amount of defocus is determined by process controller 212. Process controller 212 then changes the focus 202 of stepper 206 to produce the optimal focus.

Where either the CD or angle of profile is found to be outside the specification, process controller 212 can appropriately adjust the exposure 204 and focus 202, as well as reject the tested wafer. That wafer, along with the appropriate number of unexamined wafers, e.g., the entire lot, can then be reprocessed.

Figure 10:
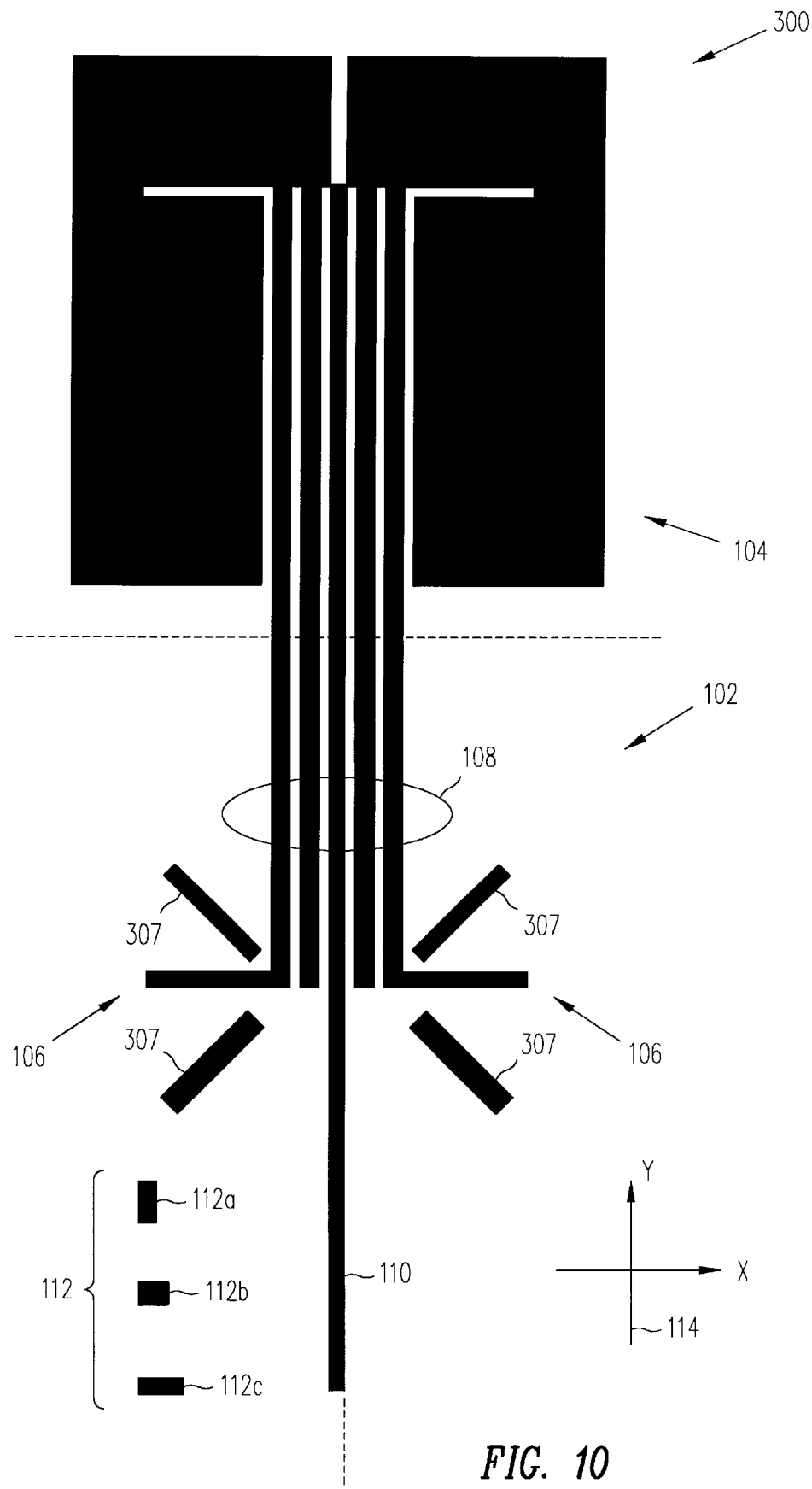
FIG. 10 illustrates a plan view of focus monitor structure, including an L shaped structure, 45 degree angled structures, densely packed lines, an isolated line, and post structures, in accordance with an embodiment of the present invention.

FIG. 10 is another embodiment of a focus monitor structure 300, which is similar to focus monitor structure 100, like designated elements being the same. Focus monitor structure 300, however, includes 45 degree angled structures 307 near L shaped structures 106. Angled structures 307 serve a similar function as L shaped structure. Of course, if desired angles other than 45 degrees may be used. It should be understood that if desired, L shaped structures 106 may be replaced with angled structures 307.

While the present invention has been described in connection with specific embodiments, one of ordinary skill in the art will recognize that various substitutions and modifications may be made after having reviewed the present disclosure. The specific embodiments described above are illustrative only. For example, alternative embodiments may vary the positions of the elements of focus monitor structure 100. Further, while FIGS. 5A–5C, 6A–6C, and 7A and 7B shows angled SEM photographs of the elements of the resist profile generated by a focus monitor structure, it should be understood that other types of topography imaging may also be used, such as atomic force microscopy. Therefore, the spirit and scope of the appended claims should not be limited to the foregoing description.

What is claimed is:

1. A test structure for monitoring a lithographic process on a substrate, said test structure comprising:
at least one monitor structure comprising:
a plurality of substantially parallel lines, each of said substantially parallel lines having a first width and separated by a first distance, said plurality of substantially parallel lines having a first length;
at least one additional line positioned substantially parallel to said plurality of substantially parallel lines, said at least one additional line having said first width and a second length, wherein said second length is greater than said first length;
at least one angled line positioned at an angle relative to said plurality of substantially parallel lines and said at least one additional line; and
a plurality of rectangular islands on said substrate.

2. The test structure of claim 1, wherein said at least one monitor structure further comprises a dark field, said dark field comprising:
a second plurality of substantially parallel lines, each of said second plurality substantially parallel lines having said first width and separated by said first distance, said second plurality of substantially parallel lines having said first length;
a second at least one additional line positioned substantially parallel to said second plurality of substantially parallel lines, said at least one additional line having said first width and said second length; and
a second at least one angled line positioned at an angle relative to said second plurality of substantially parallel lines and said at least one additional line.

3. The test structure of claim 1, wherein said at least one angled line is at least one orthogonal line positioned approximately orthogonally relative to said plurality of substantially parallel lines and said at least one additional line.

4. The test structure of claim 3, wherein said at least one orthogonal line is orthogonally connected to an outside line of said plurality of substantially parallel lines.

5. The test structure of claim 3, wherein there are two orthogonal lines, each of said two orthogonal lines orthogonally connected to an outside line of said plurality of substantially parallel lines.

6. The test structure of claim 3, wherein said first width and said first distance are the critical dimension.

7. The test structure of claim 3, wherein there are three rectangular islands on said substrate, said rectangular islands having said first width, a second width, and a third width, said second width greater than said first width and said third width less than said first width.

8. The test structure of claim 7, wherein said second width and said third width differ from said first width by a desired percentage of said first width.

9. The test structure of claim 8, wherein said desired percentage is 10%.

10. The test structure of claim 3, wherein said substrate is a lithographic reticle and said test structure is positioned at the four corners of said reticle.

11. The test structure of claim 1, wherein said test structure comprises at least two of said monitor structures, said at least two monitor structures being at an angle to one another.

12. A method of monitoring the focal condition of a lithographic process, said method comprising:
lithographically transferring a test structure from a reticle to a resist layer on a substrate, said test structure comprising at least one monitor structure comprising densely packed lines, at least one isolated line, an angled line positioned at an angle relative to said densely packed lines and said at least one isolated line, and a plurality of rectangular islands;
developing said resist layer to produce a three dimensional image of said monitor structure;
imaging an end of the three dimensional image of said angled line in said resist layer; and
measuring the angle of the resist profile at said end of said three dimensional image of said angled line.

13. The method of claim 12, wherein said at least one angled line is at least one orthogonal line positioned approximately orthogonally relative to said plurality of substantially parallel lines and said at least one additional line.

14. The method of claim 12, wherein imaging an end of the three dimensional image of said angled line is performed at an angle relative to the surface of said substrate.

15. The method of claim 12, further comprising monitoring the critical dimension generated by said lithographic process by measuring the width of at least one of the three dimensional image of said densely packed lines and said at least one isolated line.

16. The method of claim 15, further comprising altering the focus and exposure used in subsequent lithographic transferences.

17. The method of claim 16, wherein said altering the focus and exposure is performed by a process controller.

18. The method of claim 16, further comprising reprocessing said substrate when at least one of said critical dimension and said angle of said resist profile is outside a desired specification.

19. The method of claim 12, wherein said test structure comprises at least two of said monitor structures, said at least two monitor structures being at an angle to one another.

20. A method of monitoring the focal condition of a lithographic process, said method comprising:

lithographically transferring a monitor structure from a reticle to a resist layer on a substrate, said monitor structure comprising a plurality of rectangular islands, each of said plurality of rectangular islands having dimensions of approximately the critical dimension;

developing said resist layer to produce a three dimensional image of said monitor structure;

imaging at least a part of the three dimensional image of said plurality of rectangular islands; and monitoring the presence of the three dimensional image of said plurality of rectangular islands, wherein the absence of some of said three dimensional image of said plurality of rectangular islands indicates that the lithographic device is focused above the optical center of the resist layer.

* * * * *